United States Patent
Konishi et al.

[11] Patent Number: 6,161,195
[45] Date of Patent: Dec. 12, 2000

[54] EEPROM MEMORY CARD DEVICE HAVING DEFECT RELIEVING MEANS

[75] Inventors: Kazuo Konishi; Shimpei Yoshioka; Koji Maruyama; Tomoyuki Maekawa, all of Yokohama; Toshiaki Sato, Fukaya, all of Japan

[73] Assignee: Kabushiki Kaisha Toshiba, Kawasaki, Japan

[21] Appl. No.: 08/057,805

[22] Filed: May 7, 1993

[30] Foreign Application Priority Data

May 8, 1992 [JP] Japan ................................. 4-115630
May 8, 1992 [JP] Japan ................................. 4-116018

[51] Int. Cl.$^7$ ............................................... G06F 11/00
[52] U.S. Cl. .............................. 714/7; 714/5; 714/710
[58] Field of Search .................... 371/10.1, 10.2, 371/10.3; 365/185, 200, 230.03; 714/7, 710, 5, 8; 395/182.05, 182.06

[56] References Cited

U.S. PATENT DOCUMENTS

| | | | |
|---|---|---|---|
| 3,761,903 | 9/1973 | Bind, Jr. et al. | 360/47 |
| 4,365,318 | 12/1982 | Aichelmann et al. | 365/200 |
| 4,493,075 | 1/1985 | Anderson et al. | 371/10.3 |
| 4,584,681 | 4/1986 | Singh et al. | 371/10.1 |
| 4,584,682 | 4/1986 | Shah et al. | 371/10.1 |
| 4,608,687 | 8/1986 | Dutton | 371/10.2 |
| 4,654,847 | 3/1987 | Dutton | 371/10.1 |
| 5,036,460 | 7/1991 | Takahira et al. | 395/425 |
| 5,067,105 | 11/1991 | Borkenhagen et al. | 395/400 |
| 5,153,730 | 10/1992 | Nagasaki et al. . | |
| 5,263,032 | 11/1993 | Porter et al. | 371/40.2 |
| 5,267,242 | 11/1993 | Lavallee et al. | 371/10.1 |
| 5,297,148 | 3/1994 | Harari et al. | 371/10.2 |

FOREIGN PATENT DOCUMENTS

| | | |
|---|---|---|
| 0090175 | 10/1983 | European Pat. Off. . |
| 0392895 | 10/1990 | European Pat. Off. . |
| 0412039 | 2/1991 | European Pat. Off. . |
| 0424191 | 4/1991 | European Pat. Off. . |
| 59-71200 | 4/1984 | Japan . |
| 1159869 | 6/1989 | Japan . |
| 2292798 | 12/1990 | Japan . |
| 2136992 | 9/1984 | United Kingdom . |

OTHER PUBLICATIONS

Patent Abstracts of Japan, vol. 15, No. 209 (E–1072) May 28, 1991 & JP–A–03 058 685 (Olympus Optical Co Ltd).
Patent Abstracts of Japan, vol. 14, No. 341 (P–1081) Jul. 24, 1990 & JP–A–02 118 999 (Fujitsu Ltd).

*Primary Examiner*—Robert W. Beausoliel, Jr.
*Assistant Examiner*—Pierre Eddy Elisca
*Attorney, Agent, or Firm*—Pillsbury Madison & Sutro LLP

[57] ABSTRACT

This invention provides a memory card device using an EEPROM as a semiconductor memory. When a data write-in defective area is detected in the storage area of the EEPROM, a space area is retrieved from the storage area of the EEPROM as a relieving area and data to be written into the data write-in defective area is written into the relieving area. Then, when the relieving area becomes full and a data write-in defective area is detected in the storage area of the EEPROM, another space area is retrieved from the storage area of the EEPROM as a new relieving area and data to be written into the data write-in defective area is written into the new relieving area.

15 Claims, 6 Drawing Sheets

| COMPARING ITEMS | SRAM CARD | EEPROM CARD |
|---|---|---|
| 1. BACK-UP BATTERY | NECESSARY | NOT NECESSARY |
| 2. COST | HIGH | SLIGHTLY LOW |
| 3. WRITE-IN SPEED (RANDOM) | FAST | SLOW |
| (PAGE) | — — — | SLIGHTLY FAST |
| 4. READOUT SPEED (RANDOM) | FAST | SLOW |
| (PAGE) | — — — | SLIGHTLY FAST |
| 5. ERASE MODE | NOT NECESSARY | NECESSARY |
| 6. WRITE-IN VERIFY | NOT NECESSARY | NECESSARY |

EEPROM MEMORY CARD DEVICE HAVING DEFECT RELIEVING MEANS

BACKGROUND OF THE INVENTION

1. Field of the Invention

This invention relates to a memory card device having an electrically erasable and programmable read only memory (EEPROM) as a semiconductor memory contained in a card-form case, and more particularly to a memory card device suitable for use in an electronic still camera device or the like for converting an optical image of an object photographed into digital image data and storing the data into a semiconductor memory.

2. Description of the Related Art

In recent years, as is well known in the art, an electronic still camera device has been developed which converts an optical image of a photographed object into an electrical image signal by use of a solid image pickup device such as a charge coupled device (CCD), then converts the electrical signal into digital image data and storing the image data into a semiconductor memory. This type of electronic still camera device is so designed that a memory card having a semiconductor memory contained in a card-form case can be removably attached to a camera body and can be treated in the same manner as a film cartridge in a normal camera.

The memory card used in the electronic still camera device is standardized, and it must have a sufficiently large memory capacity for storing a plurality of image data items. The semiconductor memory contained in the card can be either static random access memory (SRAM), mask ROM or EEPROM in which data can be electrically programmed and erased, for example. A memory card using an SRAM has already been commercialized.

The memory card using an SRAM has advantages such as that data structures of any format can be used and that data write-in and readout speeds are high, but since SRAMs require a back-up battery to hold written data in the memory card, the memory capacity is reduced by an amount corresponding to the space occupied by the battery. Further since the cost of the SRAM itself is high, it is economically disadvantageous.

At present, in order to solve the problems caused by use of the SRAM, the use of an EEPROM as the semiconductor memory used in the memory card has received much attention. Previously, the EEPROM received much attention as a recording medium which can be used instead of the magnetic disk. The EEPROM has advantages over the SRAM in that it is not necessary to use a back-up battery for holding data and the cost of the chip itself is low. For these reasons, various studies have been conducted on the EEPROM so that it can also be used for the memory card.

Figure 1:
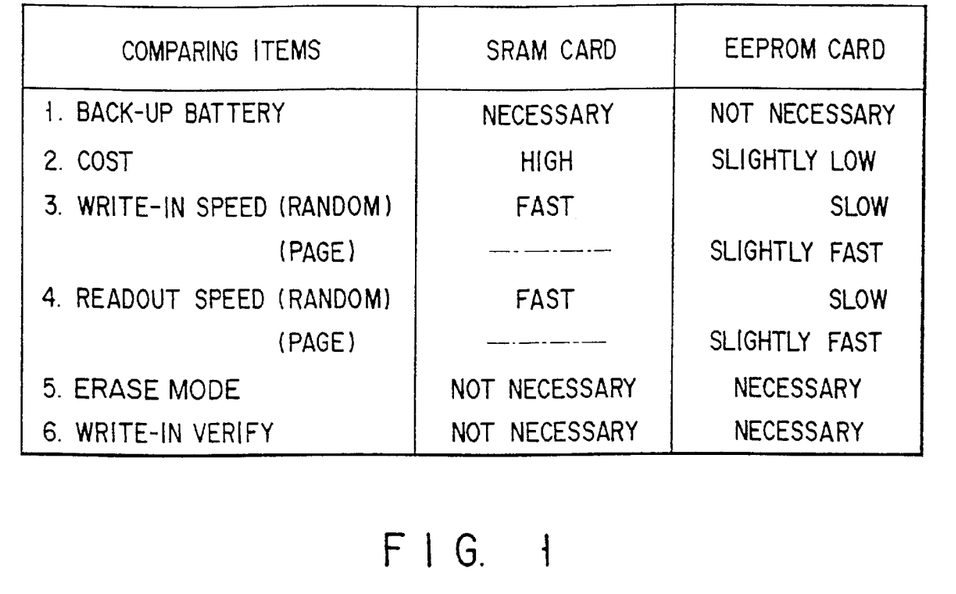
FIG. 1 is a diagram showing the advantages and disadvantages of an EEPROM card compared with those of an SRAM card.

FIG. 1 shows the advantages and disadvantages of the memory card (SRAM card) using the SRAM as compared with those of the memory card (EEPROM card) using the EEPROM. As described before, in items 1 and 2 for comparing the back-up battery and cost, the SRAM card necessitates a back-up battery and the cost thereof is high, and the EEPROM card does not necessitate a back-up battery and the cost thereof is low.

In items 3 and 4 for comparing the write-in speed and readout speed, a random access mode is commonly set for the SRAM and EEPROM, and in which data is written and read out in the unit of bytes or bits freely specified by an address also shown for comparison is a page mode which is inherent to the EEPROM and in which data is simultaneously written and read out in the unit of page by specifying a page formed of a plurality of successive bytes (several hundreds of bytes).

In the random access mode, the write-in speed and readout speed of the SRAM are both high and the write-in speed and readout speed of the EEPROM are both low. In the page mode of the EEPROM, since a large amount of data of one page can be simultaneously written in or read out, the data write-in speed and readout speed are enhanced in comparison with the case of the random access mode.

Further, the erase mode in item 5 is inherent to the EEPROM and is not provided in the SRAM. That is, when data is newly written into an area in which data is already written or data is re-written in the EEPROM, the new data cannot be written if the previously written data is not erased. Therefore, at the time of re-writing data in the EEPROM, the erase mode is effected.

In the erase mode, the simultaneous erasing operation for simultaneously erasing all the data stored in the EEPROM or the block erasing operation for erasing data for each block unit by specifying a block constructed by a plurality of successive pages is effected.

The write-in verify mode in item 6 is also inherent to the EEPROM and is not provided in the SRAM. That is, in the general data write-in operation, data cannot be completely written by one write-in operation. For this reason, each time data is written into the EEPROM, the operation of reading out the written data from the EEPROM and then checking whether the data is correctly written is necessary.

More specifically, the write-in verifying operation is effected by storing data to be written into the EEPROM in a buffer memory, transferring the data from the buffer memory and writing the data into the EEPROM, reading out the written data from the EEPROM and comparing the readout data with the content of the buffer memory to determine whether the compared contents coincide with each other. When the result of verification indicates non-coincidence (error), the operation of writing the contents of the buffer memory into the EEPROM again, reading out the written data and comparing the readout data with the contents of the buffer memory to determine whether the compared contents coincide with each other is repeatedly effected.

As is clearly understood from the above explanation, the EEPROM has its own advantages, which the SRAM does not have, in that the back-up battery is not necessary, the cost of the chip itself is low, and data can be written and read out in page units, but has disadvantages that the data write-in speed and readout speed in the random access mode are low and the erase mode and write-in verify mode which the SRAM does not necessitate are required.

When considering use of an EEPROM instead of an SRAM as a semiconductor memory for use in a memory card, it is important to solve the above-discussed problems that the data write-in speed and readout speed are low and the erase mode and write-in verify mode are necessary and to improve the detail portions of the EEPROM card so that the EEPROM card can be used in substantially the same manner as in a memory card using the SRAM.

In this case, there is a serious problem in that defects tend to occur in the memory cells of the EEPROM after a certain number of operations of re-writing data unlike the case of the SRAM and DRAM and a defective storage area in which data cannot be correctly written and stored will form. This is because the EEPROM has been developed for storing program data and intended only to re-write data at the time of version-up of the program data and is not designed to cope with a large number of data re-writing operations.

However, as described above, when the EEPROM is used instead of the SRAM in a memory card for an electronic still camera device, for example, data is frequently re-written into the EEPROM, and as a result, the generation rate of write-in defects will increase without fail.

Conventionally, the occurence of a write-in defect is defined as when data is not correctly written even after the write-in verify operation is repeatedly effected by a preset number of times. In the prior art, even when the write-in defect occurs only in part of the EEPROM, the entire memory card containing the EEPROM is treated as a defective card, and therefore, the manufacturing yield thereof is extremely low and it is economically disadvantageous. Overcoming the problem of multiple write-in defects is therefore critical to the success of a memory card device using an EEPROM as a semiconductor memory.

SUMMARY OF THE INVENTION

An object of this invention is solve the above problems and to provide a memory card device which is economically advantageous and practicable and which can effectively use the storage area of an EEPROM even if write-in defects occur partly in the EEPROM.

According to one aspect of the present invention, there is provided a memory card device using an EEPROM as a semiconductor memory, which is capable of retrieving a data relieving area from the storage area of the EEPROM when a data write-in defective area is detected in the storage area of the EEPROM, and writing data to be written into the defective area instead into the data relieving area. The device is further capable of retrieving another data relieving area from the storage area of the EEPROM when the former data relieving area is filled and a data write-in defective areas are detected, and writing data to be written into these data write-in defective areas instead into the new data relieving area.

According to the above construction, the EEPROM can be used even if it partly has a write-in defective portion, and therefore, it economically advantageous and is practicable. Further, the data relieving area is increased according to the generation rate of data write-in defective areas, and therefore, the storage area of the EEPROM can be effectively used.

DETAILED DESCRIPTION OF THE PREFERRED EMBODIMENTS

Figure 2:
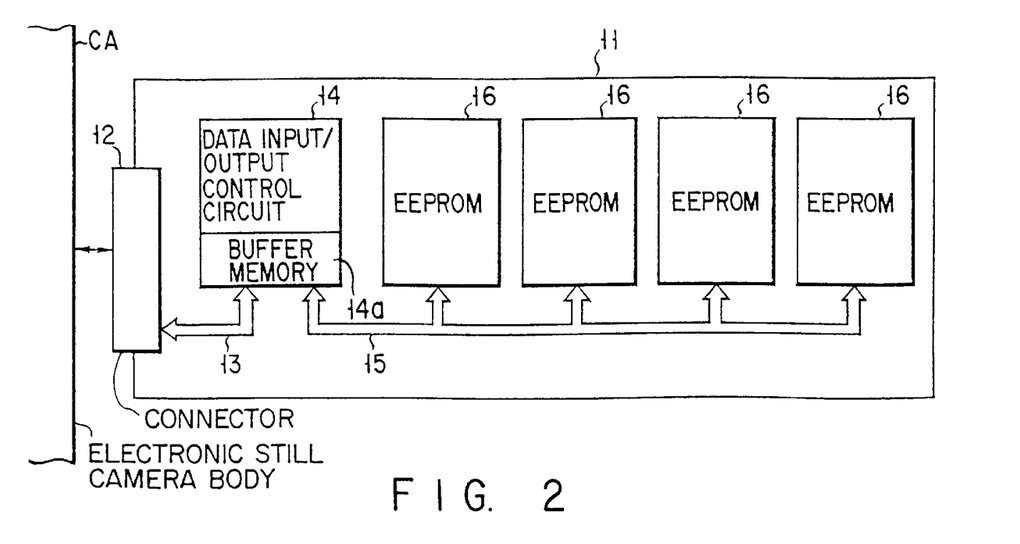
FIG. 2 is a block diagram showing the construction of one embodiment of a memory card device according to this invention.

There will now be described an embodiment of this invention applied to an electronic still camera device with reference to the accompanying drawings. In FIG. 2, a reference numeral 11 denotes a memory card body which is connected to an electronic still camera body CA via a connector 12 mounted on one end portion thereof. The connector 12 is supplied with data to be written into the memory card body 11 or address data for specifying the write-in location from the electronic still camera body CA.

Data supplied to the connector 12 is input to a data input/output control circuit 14 via a bus line 13. The data input/output control circuit 14 contains a buffer memory 14a capable of effecting high-speed data write-in and readout operations and temporarily stores input data in the buffer memory 14a. After this, the data input/output control circuit 14 reads out data stored in the buffer memory 14a via a bus line 15 at timings corresponding to the write-in cycles of a plurality of EEPROMs (four EEPROMs 16 in the example shown in FIG. 2) and stores the readout data into the EEPROMs 16.

In this case, each time data is written into the EEPROM 16 in the unit of pages, for example, the data input/output control circuit 14 reads out data written in the page from the EEPROM 16 and effects the write-in verify operation for determining whether or not the readout data coincides with data stored in the buffer memory 14a. Then, the data input/output control circuit 14 transfers data from the buffer memory 14a to the EEPROM 16 to write the data into the EEPROM 16 when data read out from the EEPROM 16 does not coincide with data stored in the buffer memory 14a, and if data read out from the EEPROM 16 completely coincides with data stored in the buffer memory 14a after the above operation is repeatedly effected a preset number of times, the data write-in operation is completed.

Next, in a case where data is read out from the EEPROM 16 to the exterior of the memory card body 11, an address for specifying data to be read out is supplied from the electronic still camera body CA to the data input/output control circuit 14 via the connector 12. Then, the data input/output control circuit 14 reads out data from the EEPROM 16 according to an input address and temporarily stores the data into the buffer memory 14a. After this, the data input/output control circuit 14 reads out data stored in the buffer memory 14a and supplies the readout data to the exterior, thus effecting the data readout operation.

According to the above construction, the data transfer between the electronic still camera body CA and the memory card body 11 is always effected via the buffer memory 14a so that the data write-in speed and data readout speed with respect to the memory card body 11 as viewed from the electronic still camera body CA can be enhanced. Further, since the write-in verify process inherent to the EEPROM 16 can be automatically effected in the memory card body 11 by use of the buffer memory 14a, the memory card body 11 can be treated just like the SRAM card.

Figure 3:
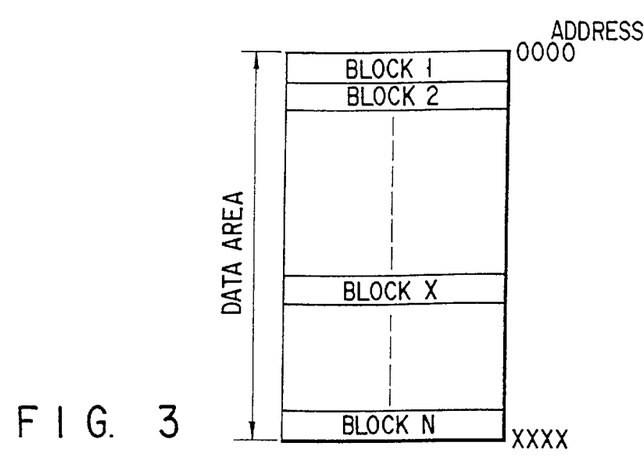
FIG. 3 is a diagram for illustrating the storage area of an EEPROM according to the above embodiment.

As shown in FIG. 3, the EEPROM 16 has a storage area which has addresses of 0000 to XXXX and which is divided into a plurality of blocks 1 to N (one block is generally formed of several kilo-bytes) each having a preset capacity which is the minimum unit of data processed by the device. All of the blocks 1 to N are used as data areas for storing normal data. The data area can be directly accessed from the exterior of the memory card body 11, and data can be freely written into or read out from the data area in units of blocks by repeatedly effecting the data write-in or readout operation by pages constructed of several hundreds of bytes each by directly designating an address via the connector 12.

Figure 4A:
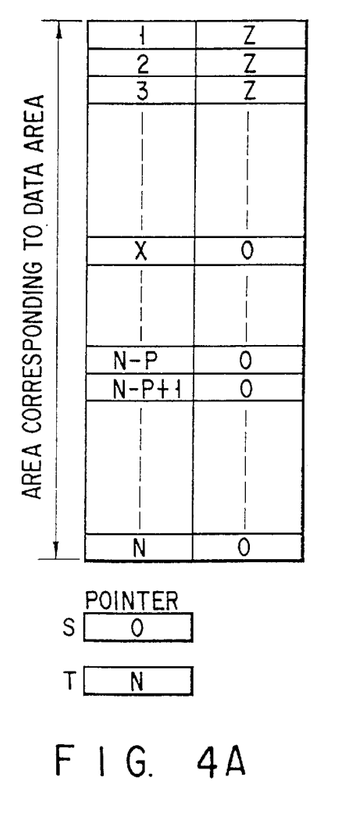
FIGS. 4A and 4B are diagrams showing control tables used in the above embodiment and illustrating the data write-in and reading operations using the tables.

As shown in FIG. 4A, in the EEPROM 16, a control table for the respective blocks and two pointers S and T are provided. That is, the left column of the control table indicates the block numbers 1 to N and the right column thereof indicates the states of the respective blocks. More specifically, "0" indicates that the block is not used and "Z (which is a numeral other than 1 to N)" indicates that the block is now used. When it is detected that a write-in defect occurs in a block, the relieving operation for writing data to be written into the block into a different block is effected, and the block number of the relieving block is written into a portion corresponding to the defective block. For example, if a numeral B is written in a position corresponding to the block number A of the control table, it indicates that the block A is a write-in defective block and data to be written into the block A is written into the block B and relieved.

Further, the pointer S indicates the defect relieving level and is set to "0" in the initial state, that has been, in a state that no write-in defect is relieved yet. The maximum value of the defect relieving level is previously set, and in this embodiment, it is set to "M". The pointer T is used to detect the remaining storage capacity of the memory card body 11 to the electronic still camera body CA and is set to "N" since all the blocks 1 to N are data areas in the initial state, that is, no write-in defect has been relieved yet. Data write-in is successively effected with respect to each of the blocks 1 to N in an increasing order, but unnecessary data may be erased and new data written such that an unused block may temporarily lie between used blocks.

If a write-in defect occurs in a block X at the time of writing data into the EEPROM 16, the data input/output control circuit 14 determines whether the defect relieving level has reached the maximum value M according to the content of the pointer S. The determination is made to determine whether the write-in defect is due to deterioration of the memory cells by repeated write-in operations or due to a defect in the whole chip caused by poor soldering, for example. Further, when the defective degree of the chip enters into a wear-out defective range, even by accumulation of defects in individual memory cells, it is preferable to discontinue use of the device from the view point of reliability.

If the defect relieving level has not reached the maximum value M, the data input/output control circuit 14 retrieves a block which is not in use or a space block to raise the defect relieving level by one step. One level step of the defect relieving level corresponds to P space blocks used as the defect relieving area. If space blocks of one level step cannot be provided, the data input/output control circuit 14 prevents a further process from being effected and inhibits use of the memory card body 11. For this reason, if it is required to successively use the memory card body 11, the user is required to erase unwanted data so that space blocks of one level step can be obtained.

Figure 4B:
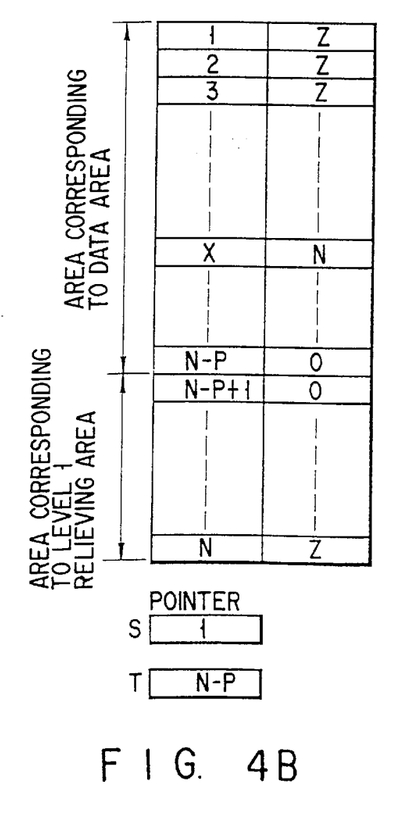

At this time, if space blocks of one level step can be retrieved, the data input/output control circuit 14 allocates the detected space blocks to a defect relieving area instead of using the same as the data area. At the time of this allocation, in order to maintain the continuity of the addresses as viewed from the electronic still camera body CA, P successive blocks N, N–1, - - - , N–P+1 which are sequentially arranged from the final block N towards a block having a small block number are changed from the data area to the defect relieving area and thus the defect relieving area of level 1 can be obtained as shown in FIG. 4B. At this time, in order to inform the electronic still camera body CA of the change of allocation, the data input/output control circuit 14 changes the content of the pointer T from "N" to "N–P". Further, the data input/output control circuit 14 increases the content of the pointer S by "1" indicate that the defect relieving level is raised by one level step.

After the P defect relieving blocks are obtained, the data input/output control circuit 14 effects the actual defect relieving process. In practice, a case wherein data to be written into the block X in which the write-in defect occurs is written into the block N which is one of the P defect relieving blocks and is thus relieved is shown in FIG. 4B. After the defect relieving process, the data input/output control circuit 14 writes the relieving block number N into a portion lying on the right side of the block X of the control table shown in FIG. 4B and writes the numeral "Z" indicating that the block is now in use into a portion lying on the right side of the block N, thus completing the relieving process for the write-in defective block X.

When data written into the EEPROM 16 as described above is read out and supplied to the electronic still camera body CA, the electronic still camera body CA checks the content of the pointer T to detect that the remaining storage capacity of the memory card body 11, that is, the number of blocks which can be used as the data area, is "N–P". Therefore, the P blocks (N–P+1) to N used as the relieving area cannot be recognized by the electronic still camera body CA. When the electronic still camera body CA requires the data readout of the block X, the data input/output control circuit 14 detects that data to be written into the block X is relieved in the block N from the control table shown in FIG. 4B, reads out data written into the block N and outputs the readout data to the electronic still camera body CA. Therefore, the data write-in/readout operation with respect to the memory card body 11 can be effected without permitting the electronic still camera body CA to be informed of the fact that the write-in defect occurs in the EEPROM 16.

Figure 5A:
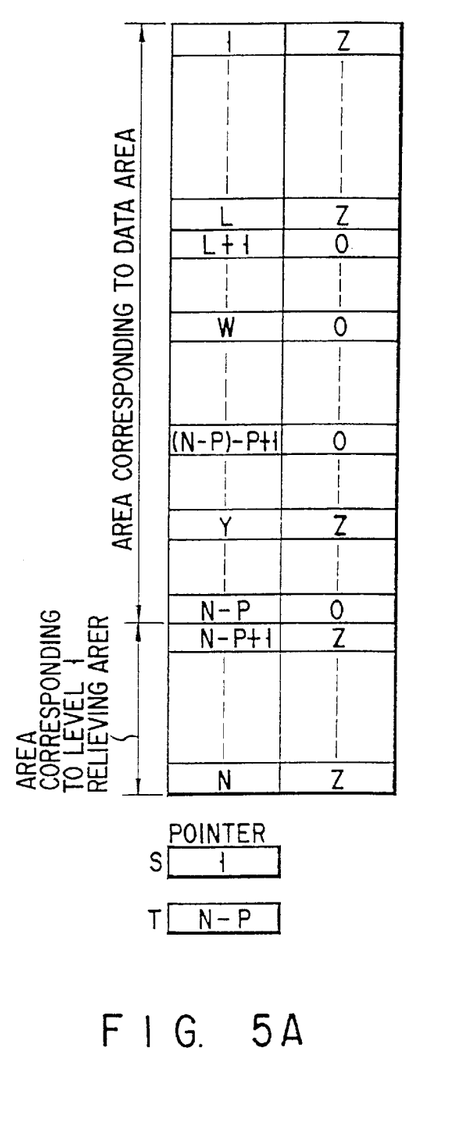
FIGS. 5A and 5B are diagrams for illustrating the countermeasure taken when the relieving area becomes full.
Figure 5B:
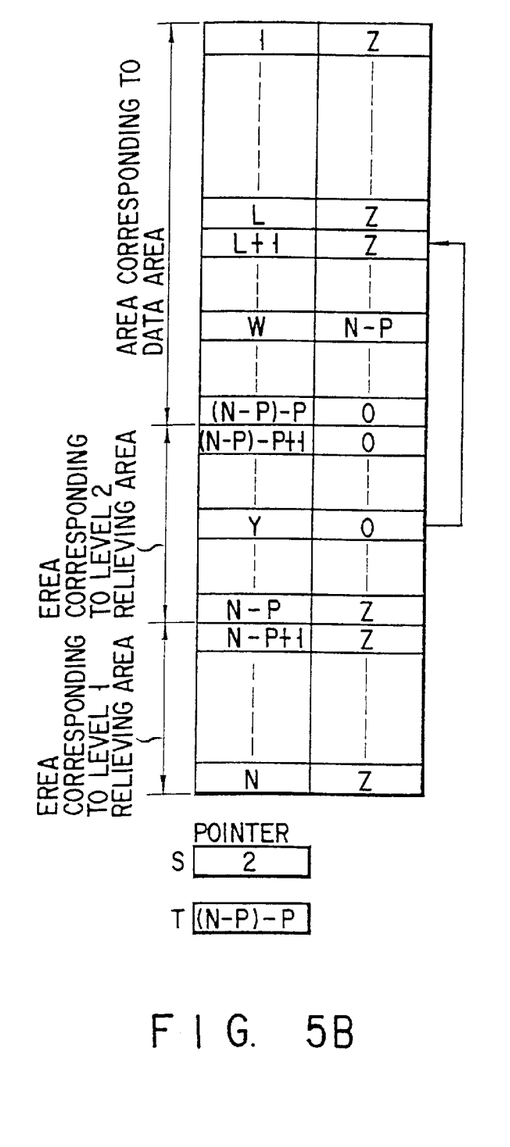

In a case where each of the blocks (N–P+1) to N in the defect relieving area of level 1 becomes full, that is, all of the blocks are used for the defect relief as shown in FIG. 5A and then the write-in defect occurs in the block W of the data area, the data input/output control circuit 14 changes the P successive blocks N–P, N–P–1, - - - , (N–P)–P+1 which are sequentially arranged from the final block towards a block having a small block number from the data area to the defect relieving area in the same manner as described before so as to provide a defect relieving area of level 2 as shown in FIG. 5B.

At this time, if a block Y among the P blocks N–P, N–P–1 , - - - , (N–P)–P+1 which are newly allocated to the defect relieving area is used, the data input/output control circuit 14 transfers data written into the block Y to a space block L+1 which has the smallest block number among the data area, writes the numeral "Z" indicating that the block is now used into a portion lying on the right side of the block L+1 in the control table and writes the numeral "0" indicating that the block is not in use into a portion lying on the right side of the block Y. Then, the data input/output control circuit 14 changes the content of the pointer T from "N–P" to "(N–P)–P" in order to inform the electronic still camera body CA of the change of allocation by creation of the new defect relieving area. Further, the data input/output control circuit 14 increases the content of the pointer S by "1" in order to indicate that the defect relieving level is further raised by one level step.

After the defect relieving area of level 2 is thus provided, the data input/output control circuit 14 effects the actual defect relieving process. In practice, a case wherein data to be written into the block W in which the write-in defect occurs is written into the block N–P which is one of the P defect relieving blocks previously obtained and is thus relieved is shown in FIG. 5B. After the defect relieving process, the data input/output control circuit 14 writes the relieving block number "N–P" into a portion lying on the right side of the block W of the control table shown in FIG. 5B and writes the numeral "Z" indicating that the block is now in use into a portion lying on the right side of the block N–P, thus completing the relieving process for the write-in defective block W.

The explanation for the operation effected when the electronic still camera body CA requires data readout of the block W is omitted since the operation may be easily understood from the explanation for the defect relieving process of level 1 made with reference to FIGS. 4A and 4B.

Figure 6:
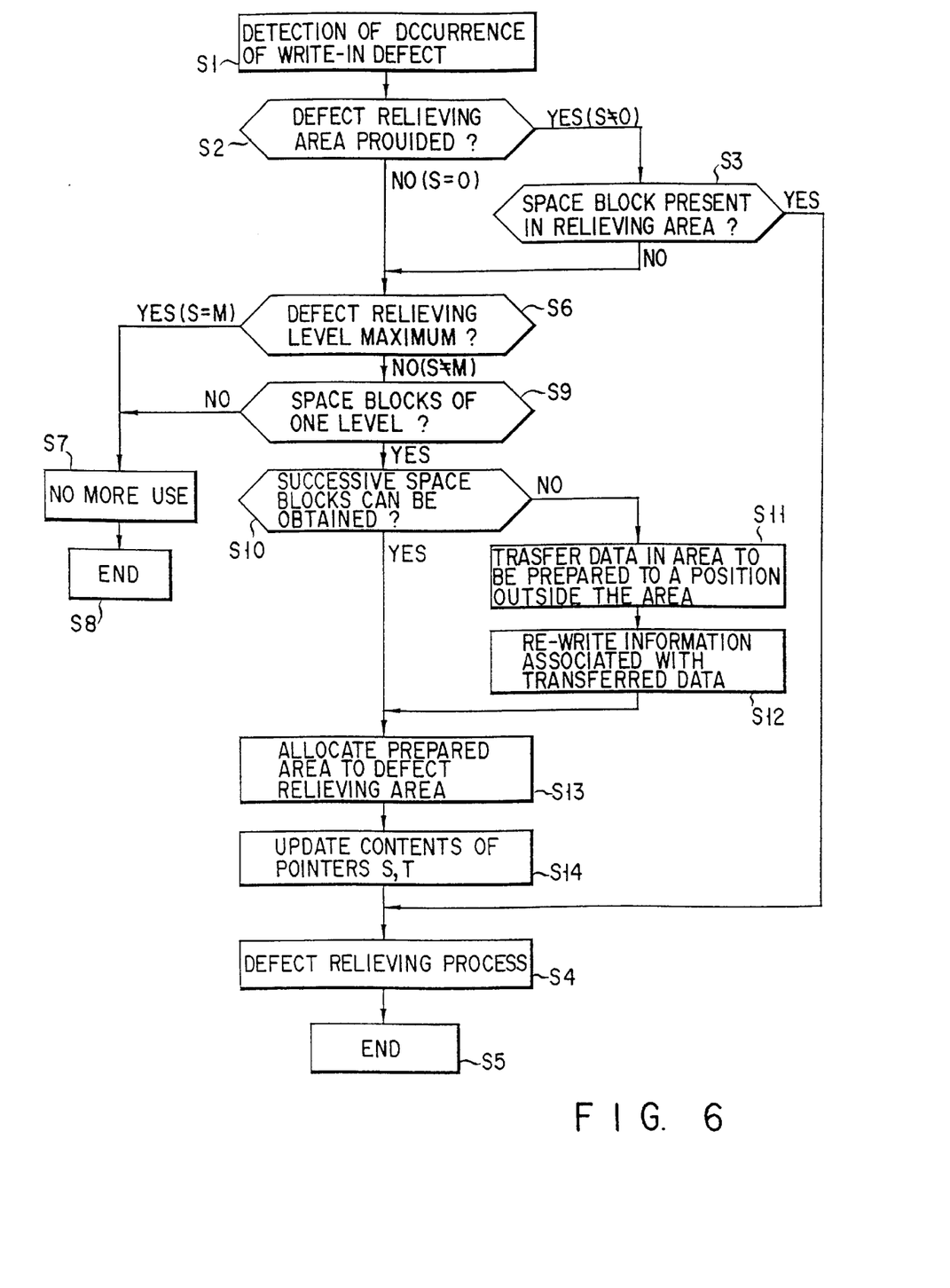
FIG. 6 is a flowchart for illustrating the operation of the above embodiment.

FIG. 6 is a flowchart showing the above operation. If the data input/output control circuit 14 detects that the write-in defect occurs in any one of the blocks (step S1), it checks in the step S2 whether the defect relieving area is provided or not, that is, whether the content of the pointer S is "0" or not. If the result of the checking operation is "YES", the data input/output control circuit 14 determines in the step S3 whether a space block is present in the defect relieving area or not. If there is a space block or the result of determination is "YES", the data input/output control circuit 14 effects the defect relieving process by use of the space block in the step S4 and completes the operation (step S5).

If it is detected in the step S2 that the defect relieving area is not provided, that is, the result of the checking operation in the step S2 is "NO", or it is detected in the step S3 that there is no space block, that is, the result of determination in the step S3 is "NO", then, the data input/output control circuit 14 checks in the step S6 whether the defect relieving level has reached the maximum level or not, that is, whether the content of the pointer S is "M" or not. If it has reached the maximum value ("YES" in the step S6), it is determined in the step S7 that the memory card body 11 cannot be used any longer and the operation is completed (step S8). If the defect relieving level has not reached the maximum level ("NO" in the step S6), the data input/output control circuit 14 checks in the step S9 whether P space blocks for forming a defect relieving area of one level step are present in the current data area. If the P blocks are not available ("NO" in the step S9), it is determined in the step S7 that the memory card body 11 cannot be used any more and the operation is completed (step S8).

If the space blocks of one level are present ("YES" in the step S9), the data input/output control circuit 14 checks in the step S10 whether P space blocks successively arranged from the final block of the current data area towards a block having a small block number can be obtained or not. If the P space blocks cannot be prepared ("NO" in the step S10), data written in a to-be-prepared area is transferred to a data area outside the to-be-prepared area in the step S11, and then, the information associated with the transferred data or the like is rewritten in the step S12.

If it is determined in the step S10 that P space blocks can be successively prepared ("YES" in the step S10), or after the process for re-writing the associated information is effected in the step S12, the data input/output control circuit 14 changes allocation of the prepared area from the data area to the defect relieving area in the step S13, updates the contents of the pointers S and T in the step S14, effects the defect relieving process in the step S4, and completes the operation (step S5).

Therefore, according to the construction of the above embodiment, when the write-in defect occurs in a block which is part of the data area, P space blocks are retrieved from the data area and allocated to the defect relieving area and data to be written into the defective block is written into the space block of the defect relieving area so that an EEPROM 16 in part of which the write-in defect occurs can be continuously used. Thus, the EEPROM is economically advantageous and is practical. When the defect relieving area becomes full, P space blocks are newly retrieved from the data area and allocated to a second defect relieving area, and data to be written into the defective block is written into the space block of the second defect relieving area. That is, since the defect relieving area is increased in the unit of P blocks according to the number of blocks in which the write-in defect occurs, the storage area of the EEPROM 16 can be effectively used.

Further, according to the above embodiment, since the data area of the EEPROM 16 is automatically reduced according to the number of blocks in which the write-in defect occurs, a problem that data cannot be written even though the apparent storage capacity still remains will not occur. Further, reduction in the data area can be effected in units of proper values such as 3 Mega-bytes, 2 Mega-bytes, 1 Mega-byte, 512 kilo-bytes, 256 kilo-bytes for the EEPROM 16 having the storage capacity of 4 Mega-bytes in the initial condition, for example. This division can meet the line-up series of normal memory cards and can be easily recognized from the exterior and is suitable when the remaining storage capacity is quantized and output (for example, N times the 256 kilo-bytes).

In the above embodiment, when the write-in defect occurs, a defect relieving area of P space blocks is created, and when the defect relieving area becomes full, a defect relieving area of another P space blocks is created. However, in this invention, the number of space blocks constructing the defect relieving area is not limited to the same number as P and can be set to a desired number each time a new defect relieving area is created.

Figure 7:
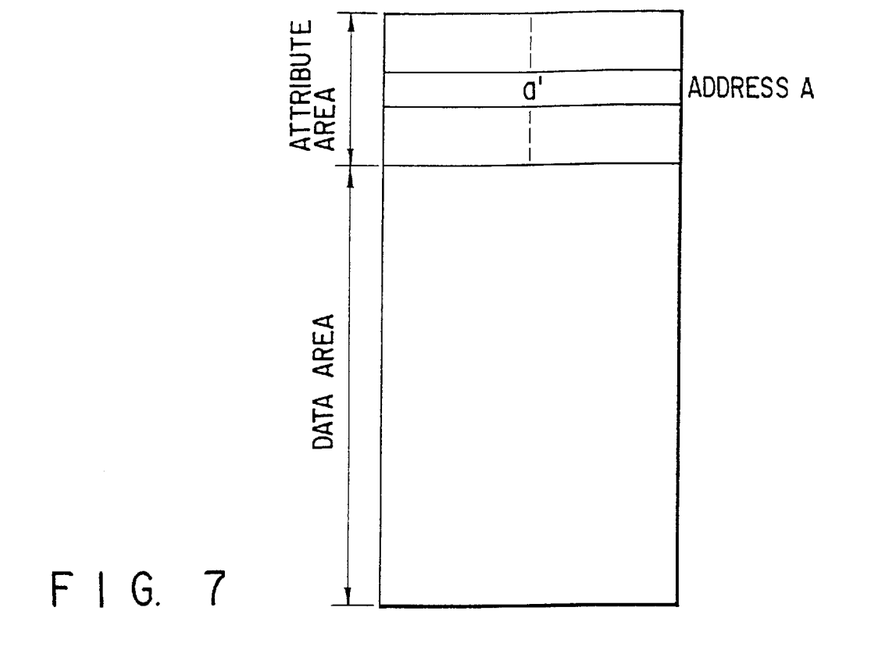
FIG. 7 is a diagram for illustrating the entire memory map of the EEPROM contained in the memory card.

FIG. 7 shows a whole memory map of the EEPROM 16 contained in the memory card body 11. That is, the address space of the EEPROM 16 is divided into an attribute area and a data area. In the attribute area are stored, various attribute information items used for informing the electronic still camera body CA which is a host device of the type of the memory card body 11, such as the whole storage capacity of the data area and the like. Further, in the attribute area, the address A indicates the a location where data indicating the remaining storage capacity of the data area is stored. Assume now that data a' indicating that the remaining storage capacity of the data area is a is stored in the location of address A.

Figure 8:
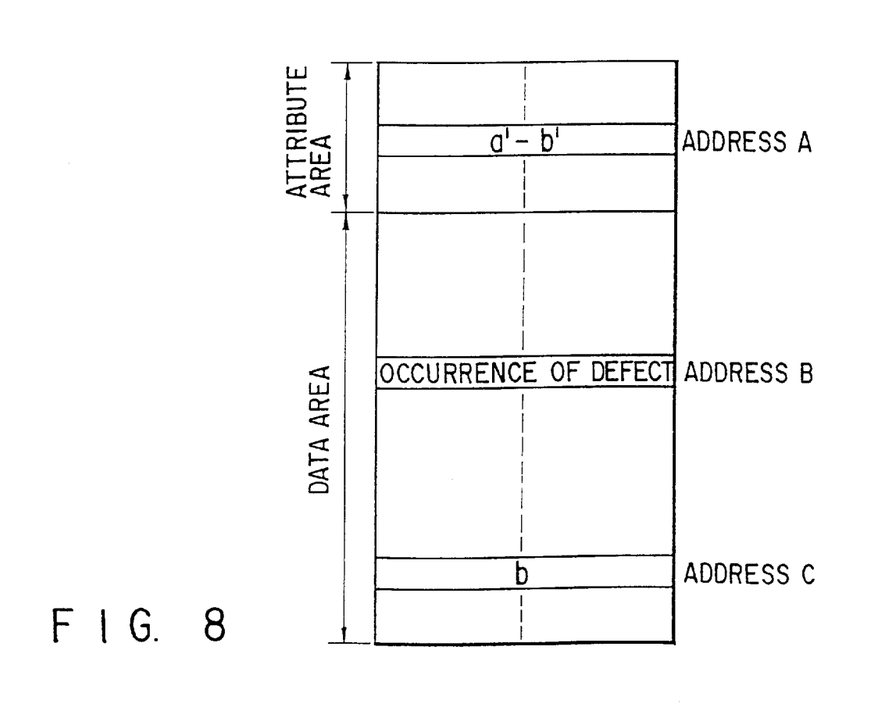
FIG. 8 is a diagram for illustrating a problem that occurs when the remaining storage capacity of a data area to be stored into the attribute area of the EEPROM becomes different from the actual remaining storage capacity of the data area after the relieving process is effected.

Further, assume that when the write-in defect occurs in an address B of the data area in the above condition as shown in FIG. 8, data b to be written into the location of address B is written instead into the location of an address C having a normal memory cell. In this case, since it is required to write data b into the location of address B, the memory card body 11 is operated to re-write the content of the address A, that is, the remaining storage capacity of the data area is adjusted from a' to (a'−b') obtained by subtracting the storage capacity b' of the address B from the storage capacity a'. However, in practice, since the write-in defect occurs in the location of address B and data b is relieved in the location of address C, the storage capacity (b'+c'), which is the sum of the storage capacity b' of the address B and the storage capacity c' of the address C, is actually removed from the storage capacity a' of the data area, therefore the remaining storage capacity (a'−b') stored in the attribute area becomes different from the actual remaining storage capacity {a'−(b'+c')} of the data area.

Figure 9:
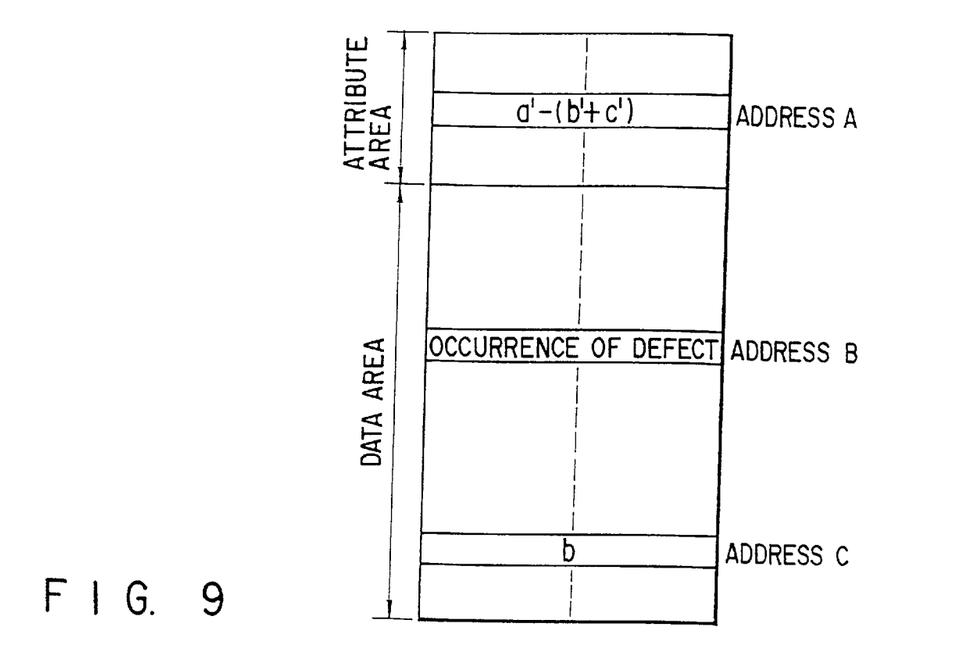
FIG. 9 is a diagram for illustrating a method for solving the problem shown in FIG. 8.

Therefore, as shown in FIG. 9, the data input/output control circuit 14 effects the relieving process for writing data b to be written into the location of address B into the location of address C having a normal memory cell when the write-in defect occurs in the location of address B of the data area. Morever, the data input/output control circuit 14 subtracts the sum of the storage capacity b' of the address B and the storage capacity c' of the address C from the remaining storage capacity a' of the data area stored in the location of address A in the attribute area based on the fact that the write-in defect occurs in the location of address B and the location of address C is used as the relieving area and stores the result of subtraction {a'−(b'+c')} into the location of address A of the attribute area as the actual remaining storage capacity of the data area.

As a result, the remaining storage capacity stored in the attribute area can coincide with the actual remaining storage capacity of the data area, and therefore, the electronic still camera body CA acting as a host device can correctly detect the remaining storage capacity of the data area by reading out the content of the address A of the attribute area. Thus, it becomes possible to prevent a problem that data cannot be actually stored into the data area although the result of readout of the content of the address A of the attribute area by the electronic still camera body CA indicates that the remaining storage capacity is available.

Figure 10:
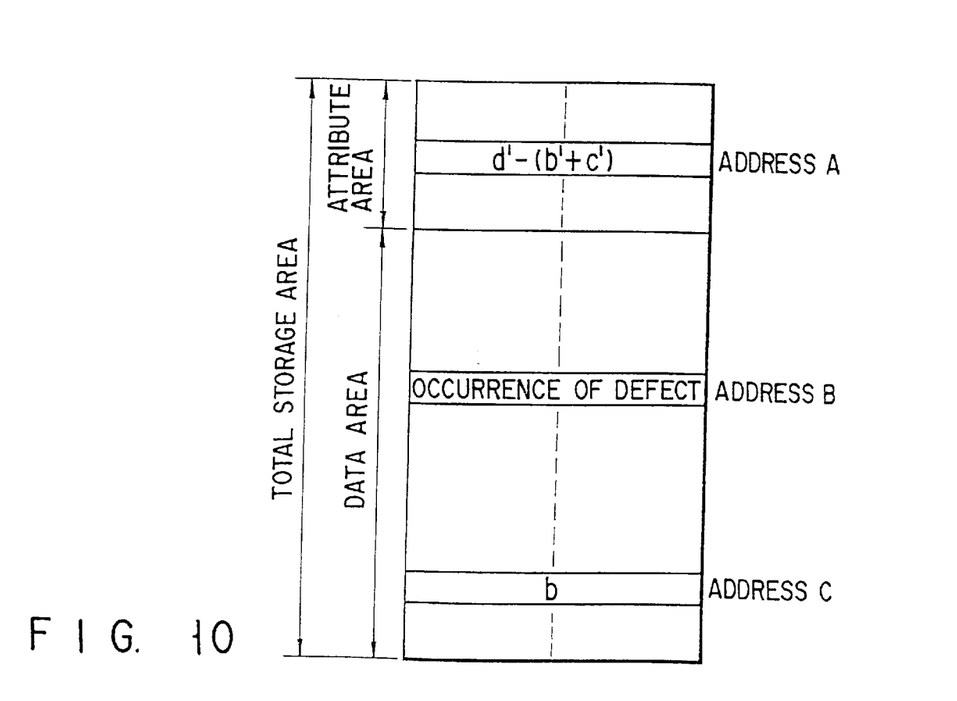
FIG. 10 is a diagram for illustrating another method for solving the problem shown in FIG. 8.

Further, as shown in FIG. 10, it is possible to write the remaining storage capacity of the total storage area including the attribute area and data area instead of the remaining storage capacity of the data area into the location of the address A of the attribute area. In this case, since the storage capacity of the attribute area is previously fixed, the remaining storage capacity of the data area can be substantially regarded as being written into the location of address A in the attribute area. In the example shown in FIG. 10, the write-in defect occurs in the address B in a condition that d' is stored in the location of the address A of the attribute area, and data b to be written into the location of the address B is written into the location of the address C. As is clearly understood from the above description, the content of the address A becomes {d'−(b'+c')}.

This invention is not limited to the above embodiment and can be variously modified without departing from the technical scope thereof.

What is claimed is:

1. A memory card device using an EEPROM as a semiconductor memory, comprising:
   a storage area divided into a plurality of space blocks, said space blocks each including EEPROM memory cells; and
   data relieving means for creating a first data relieving area by locating and identifying a predetermined number of space blocks in said storage area if and when data can not be successfully written into a first data write-in defective area in said storage area, and writing data instead into the first data relieving area, said data relieving means creating a second data relieving area by locating and identifying another predetermined number of space blocks in said storage area if and when the first data relieving area becomes full and data can not be successfully written into a second data write-in defective area in said storage area, and writing data instead into the second data relieving area.

2. The memory card device according to claim 1, wherein said data relieving means includes a control table having a plurality of entries representing each space block in the storage area, wherein when data can not be successfully written into a data write-in defective area in the storage area, those entries of the control table representing space blocks comprising the data write-in defective area are updated to indicate the position in the storage area of a data relieving area which contains data which was to be written into the data write-in defective area.

3. The memory card device according to claim 2, wherein said data relieving means has a first pointer which is updated when the data relieving area is prepared in the storage area and which indicates the number of data relieving areas prepared in the storage area.

4. The memory card device according to claim 3, wherein said data relieving means has a second pointer which is updated when the data relieving area is prepared in the storage area and which indicates the number of space blocks which have not been used by the data relieving means remaining in the storage area.

5. The memory card device according to claim 4, wherein said data relieving means does not locate and identify a new data relieving area when data can not be successfully written into a new data write-in defective area in the storage area and all previous data relieving areas have become full and when the number of previous relieving areas has reached a predetermined maximum level.

6. The memory card device according to claim 4, wherein said data relieving means locates and identifies a predetermined number of successive space blocks sequentially arranged in the storage area as the data relieving area when data can not be successfully written into the data write-in defective area.

7. The memory card device according to claim 6, wherein each entry of the control table is initially set to a first value indicating that no data is stored in each space block, and wherein when data is successfully written into a data write-in area in said storage area, those entries of the control table representing space blocks comprising the data write-in area are set to a second value indicating that data is already stored in the data write-in area.

8. The memory card device according to claim 6, wherein said data relieving means creates the predetermined number of successive space blocks as the data relieving area by transferring data already stored in a space block within the data relieving area to a space block outside the data relieving area when the data relieving means can not locate and identify the predetermined number of successive space blocks for constructing the data relieving area in the storage area.

9. The memory card device according to claim 6, wherein said data relieving means provides a new data relieving area adjacent to an already prepared data relieving area in the storage area when said already prepared data relieving area becomes full and the data write-in defective area is detected in the storage area.

10. The memory card device according to claim 3, 4, 7, 8, or 9, wherein said space blocks each have a capacity of several kilo-bytes and the operation of writing data into the space blocks is performed in units of pages, each page containing several hundreds of bytes.

11. The memory card device according to claim 2, further comprising an attribute area in which attribute information of data written into the storage area and the remaining storage capacity of the storage area into which data can be written is stored.

12. The memory card device according to claim 11, wherein the remaining storage capacity written into the attribute area is reduced according to the capacity of the data write-in defective area and the capacity of the data relieving area when the data write-in defective area is detected in the storage area by said data relieving means and data to be written into the data write-in defective area is written instead into the data relieving area.

13. A memory card device comprising:
- a storage area divided into a plurality of space blocks, each of said space blocks including a predetermined number of memory cells; and
- a data control circuit which creates a data relief area in said storage area if and when it detects that data can not be successfully written into a defective area in said storage area, said data control circuit creating said data relief area by locating and identifying a predetermined number of space blocks in said storage area and writing data destined for said defective area instead into said data relief area, said data control circuit being operative such that said storage area contains no data relief areas before said defective area is detected.

14. The memory card device according to claim 13, wherein said data control circuit creates a second data relief area in said storage area if and when it detects that data can not be successfully written into a second defective area in said storage area and said data relief area is full, said data control circuit creating said second data relief area by locating and identifying another predetermined number of space blocks in said storage area and writing data destined for said second defective area instead into said second data relief area, said data control circuit being operative such that said storage area contains only said data relief area before said second defective area is detected.

15. The memory card device according to claim 13, wherein said data control circuit does not create a new data relief area in said storage area if and when it detects that data can not be successfully written into a new defective area in said storage area and when previous data relief areas are full, and when the number of said previous data relief areas has reached a predetermined maximum.

* * * * *